US012672243B2

(12) United States Patent
Nagata et al.

(10) Patent No.: US 12,672,243 B2
(45) Date of Patent: Jun. 30, 2026

(54) FLEXIBLE PRINTED CIRCUIT BOARD AND METHOD OF MANUFACTURING FLEXIBLE PRINTED CIRCUIT BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Shingo Nagata, Osaka (JP); Shoichiro Sakai, Osaka (JP); Daisuke Sato, Shiga (JP); Junichi Motomura, Shiga (JP)

(73) Assignees: Sumitomo Electric Industries, Ltd., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 167 days.

(21) Appl. No.: 18/036,816

(22) PCT Filed: Apr. 12, 2022

(86) PCT No.: PCT/JP2022/017552
§ 371 (c)(1),
(2) Date: May 12, 2023

(87) PCT Pub. No.: WO2022/224866
PCT Pub. Date: Oct. 27, 2022

(65) Prior Publication Data
US 2023/0413451 A1     Dec. 21, 2023

(30) Foreign Application Priority Data
Apr. 22, 2021     (JP) ................................. 2021-072660

(51) Int. Cl.
*H05K 1/11* (2006.01)
*H05K 3/18* (2006.01)
*H05K 3/42* (2006.01)

(52) U.S. Cl.
CPC ............. *H05K 3/429* (2013.01); *H05K 1/118* (2013.01); *H05K 3/181* (2013.01)

(58) Field of Classification Search
CPC ........ H05K 3/181; H05K 3/244; H05K 3/387; H05K 3/16; H05K 1/118; H05K 1/189;
(Continued)

(56) References Cited

U.S. PATENT DOCUMENTS 3,099,608 A * 7/1963 Radovsky ............... C23C 18/28
                                                       205/159
3,506,482 A * 4/1970 Tsuneshi ............. C23C 18/1608
                                                       428/209
(Continued)

FOREIGN PATENT DOCUMENTS

| | | |
|---|---|---|
| CN | 102686052 A | 9/2012 |
| JP | 2016-035992 A | 3/2016 |
| KR | 10/1555014 B | 9/2015 |

*Primary Examiner* — Roshn K Varghese
(74) *Attorney, Agent, or Firm* — Renner, Otto, Boisselle & Sklar, LLP

(57) ABSTRACT

A flexible printed circuit board includes: an electrically insulating layer having a first surface and a second surface opposite to the first surface; a first wiring disposed on the first surface; a second wiring disposed on the second surface; and an electrically conductive layer. The first wiring includes a first land. The second wiring includes a second land. The first wiring includes a first layer disposed on the first surface and a second layer disposed on the first layer. The second wiring includes a third layer disposed on the second surface and a fourth layer disposed on the third layer. The first land and the second land overlap each other in a plan view. The electrically insulating layer is provided with a through hole extending through the electrically insulating layer in a thickness direction and overlapping the first land and the second land at least partially in the plan view.

4 Claims, 13 Drawing Sheets

(58) Field of Classification Search
CPC .................. H05K 1/113; H05K 1/115; H05K
2201/0154; H05K 3/42–429; H05K
1/116; H05K 2201/0919; H05K
2201/095; H05K 2201/09645; H05K
2203/0723
See application file for complete search history.

(56) References Cited

U.S. PATENT DOCUMENTS

| | | | | |
|---|---|---|---|---|
| 5,980,721 A * | 11/1999 | Prevotat | ................. | H05K 3/062 |
| | | | | 205/920 |
| 7,317,245 B1 * | 1/2008 | Lee | ........................ | H05K 3/243 |
| | | | | 257/70 |
| 2017/0118837 A1 * | 4/2017 | Miura | ...................... | H05K 1/09 |
| 2020/0107443 A1 * | 4/2020 | Takahashi | ............ | H05K 1/0393 |

* cited by examiner

FLEXIBLE PRINTED CIRCUIT BOARD AND METHOD OF MANUFACTURING FLEXIBLE PRINTED CIRCUIT BOARD

TECHNICAL FIELD

The present disclosure relates to a flexible printed circuit board and a method for manufacturing the flexible printed circuit board. This application claims priority based on Japanese Patent Application No. 2021-072660 filed on Apr. 22, 2021, and the entire contents of the Japanese patent application are incorporated herein by reference.

BACKGROUND ART

For example, Japanese Unexamined Patent Application Publication No. 2016-35992 (PTL 1) describes a method for manufacturing a flexible printed circuit board by a semi-additive process. In the semi-additive method, first, an underlying metal layer is formed on a base film. Second, a patterned resist layer is formed on the underlying metal layer. Third, a conductive pattern is electroplated on the underlying metal layer exposed from the resist layer. Fourth, the resist layer is removed and the underlying metal layer under the resist layer is removed by etching.

PRIOR ART DOCUMENT

Patent Literature

PTL 1: Japanese Unexamined Patent Application Publication No. 2016-35992

SUMMARY OF INVENTION

A flexible printed circuit board of the present disclosure includes: an electrically insulating layer having a first surface and a second surface opposite to the first surface; a first wiring disposed on the first surface; a second wiring disposed on the second surface; and an electrically conductive layer. The first wiring includes a first land. The second wiring includes a second land. The first wiring includes a first layer disposed on the first surface and a second layer disposed on the first layer. The second wiring includes a third layer disposed on the second surface and a fourth layer disposed on the third layer. The first land and the second land overlap each other in a plan view. The electrically insulating layer is provided with a through hole extending through the electrically insulating layer in a thickness direction and overlapping the first land and the second land at least partially in the plan view. The electrically conductive layer is disposed on an inner wall surface of the through hole to be connected to the first land and the second land. The second layer, the fourth layer, and the electrically conductive layer are electrolytic plating layers made of the same material. A thickness of each of the first land and the second land is 0.5 time or more as large as a thickness of the electrically insulating layer.

DESCRIPTION OF EMBODIMENTS

Figure 1:
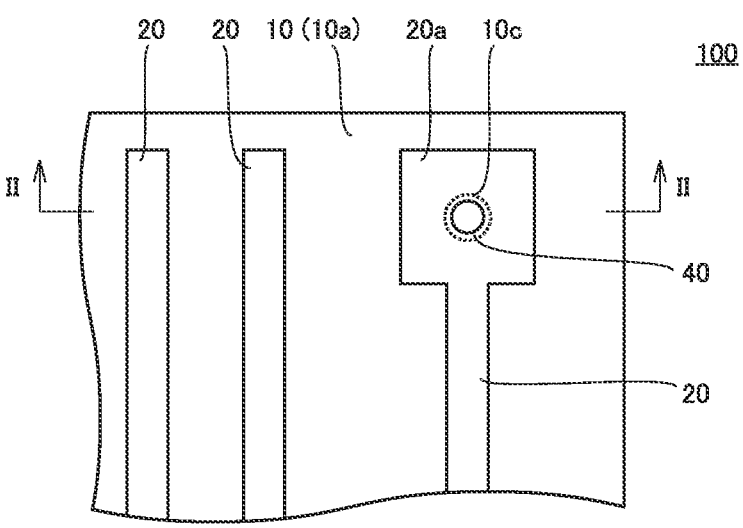
FIG. 1 is a plan view of a flexible printed circuit board 100.

Problems to be Solved by Present Disclosure

In order to connect the wiring disposed on the front surface of the base film to the wiring disposed on the back surface of the base film, a through hole is formed in the base film, and an electrically conductive layer for connecting the wiring disposed on the front surface of the base film to the wiring disposed on the back surface of the base film is formed on the inner wall surface of the through hole. In order to form the electrically conductive layer on the inner wall surface of the through hole together with the conductive pattern by electrolytic plating, a conductive treatment is performed on the inner wall surface of the through hole before forming the resist layer. The conductive treatment is carried out by forming an electroless plating layer on the inner wall surface of the through hole.

As a result of the above-described process, an electroless plating layer as Fell as an underlying metal layer exist under the resist layer. Therefore, a longer time is required for etching after the resist layer is removed, and there is a possibility that the undercut of the wiring becomes large.

The present disclosure has been made in view of the problems of the prior art as described above. More specifically, the present disclosure provides a flexible printed circuit board capable of suppressing undercutting of wiring.

Advantageous Effects of Present Disclosure

According to the flexible printed circuit board of the present disclosure, the undercut of the wiring can be suppressed.

Description of Embodiments of Present Disclosure

First, embodiments of the present disclosure will be listed and explained, (1) A flexible printed circuit board according to an embodiment includes: an electrically insulating layer having a first surface and a second surface opposite to the first surface; a first wiring disposed on the first surface; a second wiring disposed on the second surface; and an electrically conductive layer. The first wiring includes a first land. The second wiring includes a second land. The first wiring includes a first layer disposed on the first surface and a second layer disposed on the first layer. The second wiring includes a third layer disposed on the second surface and a fourth layer disposed on the third layer. The first land and the second land overlap each other in a plan view. The electrically insulating layer is provided with a through hole extending through the electrically insulating layer in a thickness direction and overlapping the first land and the second land at least partially in the plan view. The electrically conductive layer is disposed on an inner wall surface of the through hole to be connected to the first land and the second land. The second layer, the fourth layer, and the electrically conductive layer are electrolytic plating layers made of the same material. A thickness of each of the first land and the second land is 0.5 time or more as large as a thickness of the electrically insulating layer.

According to the flexible printed circuit board of (1), it is possible to suppress the undercut of the wiring.

(2) In the flexible printed circuit board according to (1), the thickness of each of the first land and the second land may be 0.75 time or more as large as the thickness of the electrically insulating layer.

According to the flexible printed circuit board of (2), the reliability of the electrically conductive layer can be enhanced.

(3) In the flexible printed circuit board according to (1) or (2), palladium particles may be dispersed between the inner wall surface of the through hole and the electrically conductive layer.

According to the above (3), generation of voids in the electrically conductive layer can be suppressed.

(4) In the flexible printed circuit board according to any one of (1) to (3), an inner diameter of the through hole may be more than or equal to the thickness of the electrically insulating layer.

(5) In the flexible printed circuit board according to any one of (1) to (4), the first layer may be a sputtered layer.

(6) A method of manufacturing a flexible printed circuit board according to an embodiment includes: preparing an electrically insulating layer; and forming a first wiring including a first land, and a second wiring including a second land. The electrically insulating layer has a first surface and a second surface opposite to the first surface. The electrically insulating layer is provided with a through hole extending through the electrically insulating layer in a thickness direction and overlapping the first land and the second land at least partially in a plan view. The forming of the first wiring and the second wiring includes forming a first layer on the first surface, forming a first resist layer on the first layer, forming a second layer on the first layer exposed from the first resist layer, forming a third layer on the second surface, forming a second resist layer on the third layer, and forming a fourth layer on the third layer exposed from the second resist layer. The forming of the second layer and the forming of the fourth layer are performed by electrolytic plating. In the forming of the second layer and the forming of the fourth layer, the second layer and the fourth layer grow along an inner wall surface of the through hole to form an electrically conductive layer on the inner wall surface of the through hole. The first resist layer and the second resist layer are removed after the second layer and the fourth layer are formed. The first layer below the first resist layer that has been removed and the third layer below the second resist layer that has been removed are removed by etching after the second layer and the fourth layer are formed, A thickness of each of the first land and the second land is 0.5 time or more as large as a thickness of the electrically insulating layer.

According to the method of manufacturing the flexible printed circuit board in (6), it is possible to suppress the undercut of the wiring.

Details of Embodiments of Present Disclosure

The details of embodiments of the present disclosure will now be described with reference to the drawings. In the following drawings, the same or corresponding parts are denoted by the same reference numerals, and redundant description will not be repeated.

(Configuration of Flexible Printed Circuit Board According to Embodiment)

Hereinafter, a configuration of a flexible printed circuit board (referred to as a "flexible printed circuit board 100") according to an embodiment will be described.

Figure 2:
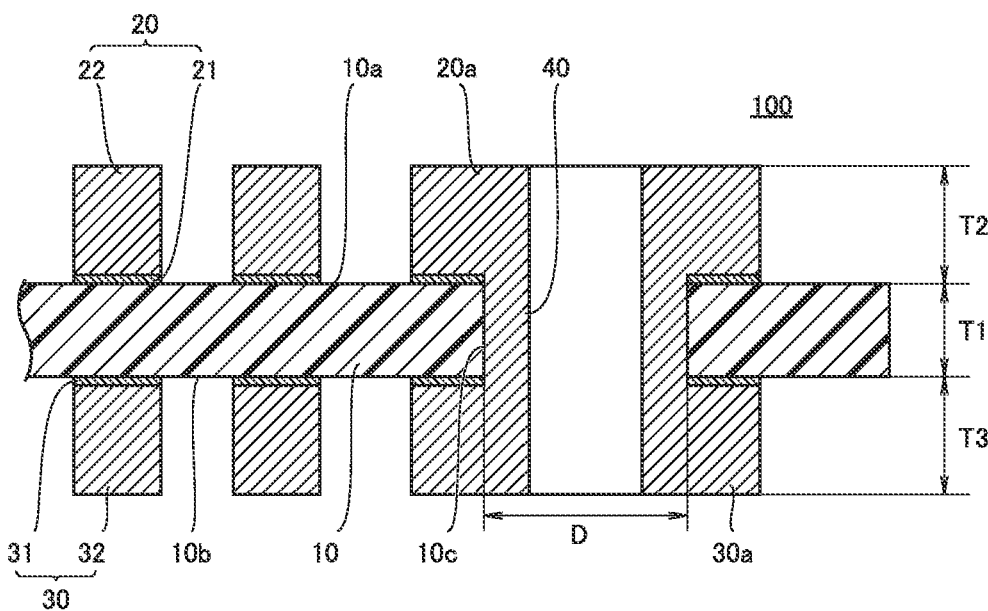
FIG. 2 is a cross-sectional view taken along a line II-II of FIG. 1.

FIG. 1 is a plan view of flexible printed circuit board 100. FIG. 2 is a cross-sectional view taken along a line 1141 of FIG. 1. As shown in FIGS. 1 and 2, flexible printed circuit board 100 includes an electrically insulating layer 10, a first wiring 20, a second wiring 30, and an electrically conductive layer 40.

Electrically insulating layer 10 is made of a material having electrical insulation and flexibility. Specific examples of the material constituting electrically insulating layer 10 include polyimide, polyethylene terephthalate, and fluororesin. Electrically insulating layer 10 has a first surface 10a and a second surface 10b. First surface 10a and second surface 10b are end surfaces of electrically insulating layer 10 in the thickness direction. Second surface 10b is a surface opposite to first surface 10a. The thickness of electrically insulating layer 10 is referred to as a thickness T1. Thickness T1 is, for example, 5 μm to 100 μm.

First wiring 20 is disposed on first surface 10a. First wiring 20 has a first land First land 20a is, for example, at an end of first wiring 20. First land 20a has, for example, a rectangular shape in a plan view. The thickness of first land 20a is referred to as a thickness T2. Thickness T2 is 0.5 time or more as large as thickness T1. Thickness T2 may be 0.75 time or more as large as thickness T1. Thickness T2 may be 1.0 time or more as large as thickness T1. Thickness T2 may be 2.0 times or less as large as thickness T1. Thickness T2 may be 4.0 times or less as large as thickness T1, or may be 6.0 times or less as large as thickness T1. Thickness T2 may be less than 0.5 time as large as an inner diameter D described below.

First wiring 20 includes a first layer 21 and a second layer 22. First layer 21 is made of, for example, copper (Cu). First layer 21 is, for example, a sputtered layer (a layer formed by sputtering). Second layer 22 is made of, for example, copper. Second layer 22 is an electrolytic plating layer (a layer formed by electrolytic plating). Second layer 22 is disposed on first layer 21. The thickness of first layer 21 is less than the thickness of second layer 22.

Second wiring 30 is disposed on second surface 10b. Second wiring 30 has a second land 30a. Second land 30a is, for example, at an end of second wiring 30. Second land 30a has, for example, a rectangular shape in a plan view, Second land 30a overlaps first land 20a in the plan view. First land 20a and second land 30a may have the same shape and the same size in the plan view. First land 20a and second land 30a may have Shapes or sizes different from each other in the plan view. The thickness of second land is referred to as a thickness T3. Thickness T3 is 0.5 time or more as large as thickness T1. Thickness T3 is 0.75 time or more as large as thickness T1. Thickness T3 may be 1.0 time or more as large as thickness T1. Thickness T3 may 2.0 times or less as large as thickness T1. Thickness T3 may be 4.0 times or less as large as thickness T1 or may be 6.0 times or less as large as thickness T1. Thickness 13 may be less than 0.5 times inner diameter D described, below.

Second wiring 30 includes a third layer 31 and a fourth layer 32. Third layer 31 is made of, for example, copper. Third layer 31 is, for example, a sputtered layer. Fourth layer 32 is made of, for example, copper. Fourth layer 32 is an electrolytic plating layer. In other words, fourth layer 32 is an electrolytic plating layer made of the same material as second layer 22. Fourth layer 32 is disposed on third layer 31. The thickness of third layer 31 is less than the thickness of fourth layer 32.

A through hole 10c is formed in electrically insulating layer 10. Through hole 10c extends through electrically insulating layer 10 along the thickness direction. Through hole 10c overlaps first land 20a and second land 30a in the plan view. Through hole 10c may partially overlap first land 20a and second land 30a in the plan view. The inner diameter of through hole 10c is referred to as inner diameter D. Inner diameter D is equal to or more than thickness T1.

Electrically conductive layer 40 is disposed on the inner wall surface of through hole 10c. Electrically conductive layer 40 is connected to first land 20a and second land 30a. Thus, first land 20a and second land 30a are electrically connected to each other. Electrically conductive layer 40 is made of copper, for example. Electrically conductive layer 40 is an electrolytic plating layer. In other words, electrically conductive layer 40 is an electrolytic plating layer made of the same material as second layer 22 and fourth layer 32. Electrically conductive layer 40 disposed on the inner wall surface of through hole 10c may have a single-layer structure.

(Method of Manufacturing Flexible Printed Circuit Board According to Embodiment)

Hereinafter, a method of manufacturing flexible printed circuit board 100 will be described.

Figure 3:
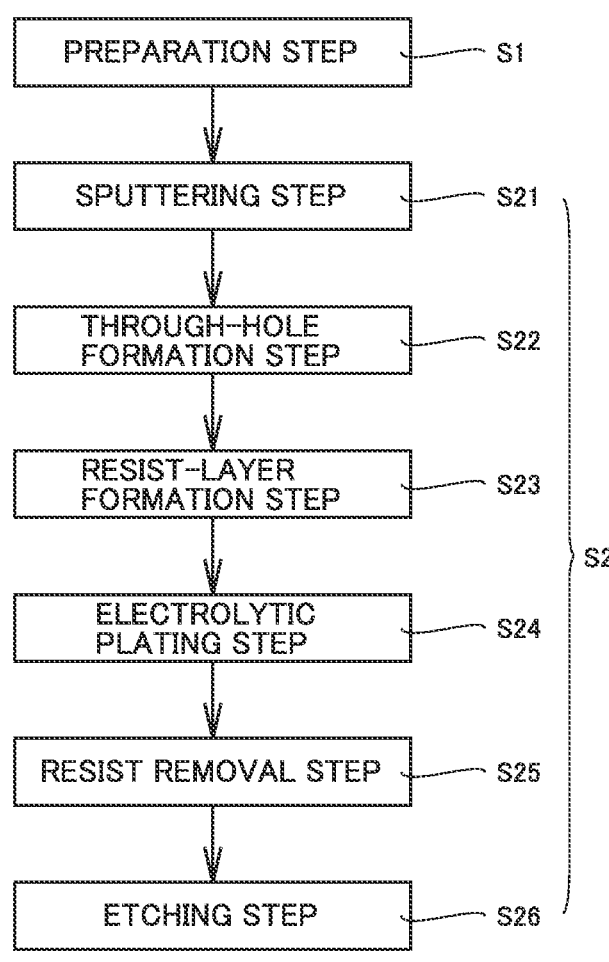
FIG. 3 is a process diagram of a method for manufacturing flexible printed circuit board 100.

FIG. 3 is a process diagram of the method of manufacturing flexible printed circuit board 100. As shown in FIG. 3, the method of manufacturing flexible printed circuit board 100 includes a preparation step S1 and a wiring formation step S2. Wiring formation step S2 is performed after preparation step S1.

In preparation step S1, electrically insulating layer 10 is prepared. Through hole 10c is not formed in electrically insulating layer 10 prepared in preparation step S1. Wiring formation step S2 includes a sputtering step S21, a through-hole formation step S22, a resist-layer formation step S23, an electrolytic plating step S24, a resist removal step S25, and an etching step S26.

Through-hole formation step S22 is performed after sputtering step S21. Resist-layer formation step S23 is performed after through-hole formation step S22. Electrolytic plating step S24 is performed after resist-layer formation step S23. Resist removal step S25 is performed after electrolytic plating step S24. Etching step S26 is performed after resist removal step S25.

Figure 4:
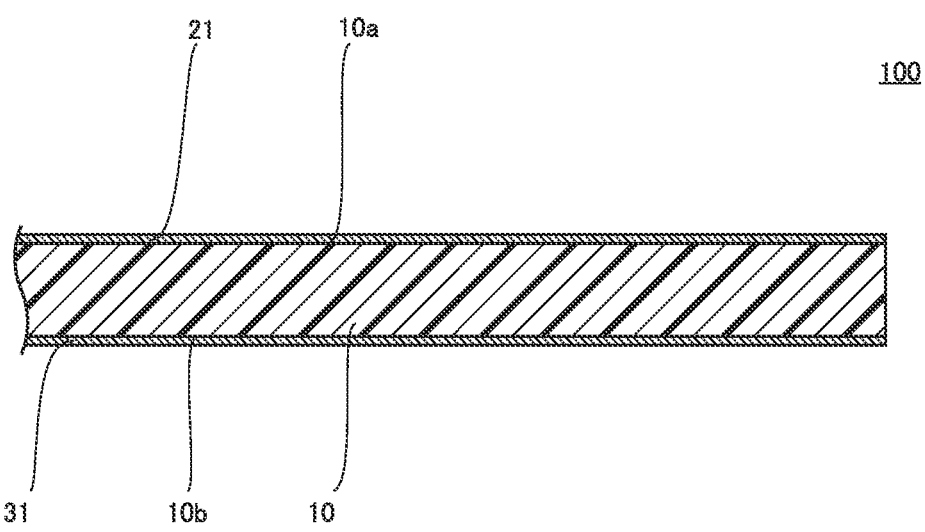
FIG. 4 is a cross-sectional view of flexible printed circuit board 100 after a sputtering step S21 is performed.

FIG. 4 is a cross-sectional view of flexible printed circuit board 100 after sputtering step S21 is performed. As shown in FIG. 4, in sputtering step S21, sputtering is performed to form first layer 21 on first surface 10a and to form third layer 31 on second surface 10b.

Figure 5:
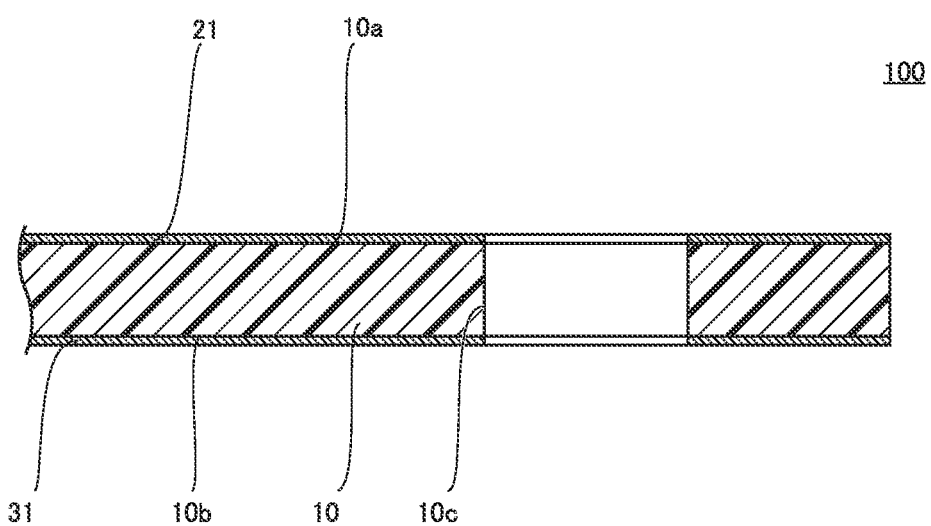
FIG. 5 is a cross-sectional view of flexible printed circuit board 100 after a through-hole formation step S22 is performed.

FIG. 5 is a cross-sectional view of flexible printed circuit board 100 after through-hole formation step S22 is performed. As shown in FIG. 5, in through-hole formation step S22, a through-hole 10c is formed. Through hole 10c is formed by, for example, laser processing or mechanical processing using a drill or the like.

Figure 6:
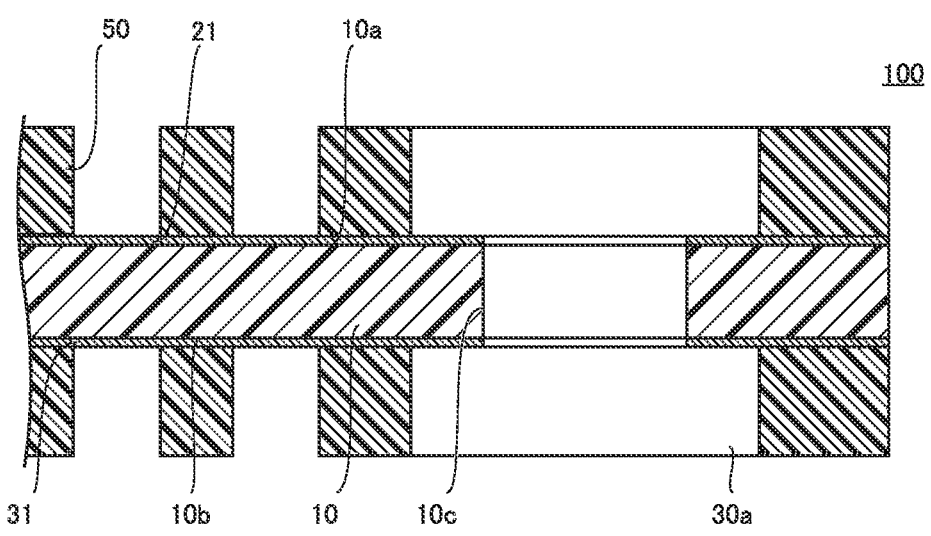
FIG. 6 is a cross-sectional view of flexible printed circuit board 100 after a resist-layer formation step S23 is performed.

FIG. 6 is a cross-sectional view of flexible printed circuit board 100 after resist-layer formation step S23 is performed. As shown in FIG. 6, in resist-layer formation step S23, a resist layer 50 is formed on first layer 21 and third layer 31. In the formation of resist layer 50, first, a film of a photosensitive organic material constituting resist layer 50 is formed. Second, exposure and development are performed on the photosensitive organic material constituting formed resist layer 50. Thus, patterned resist layer 50 is formed on first layer 21 and third layer 31.

Figure 7:
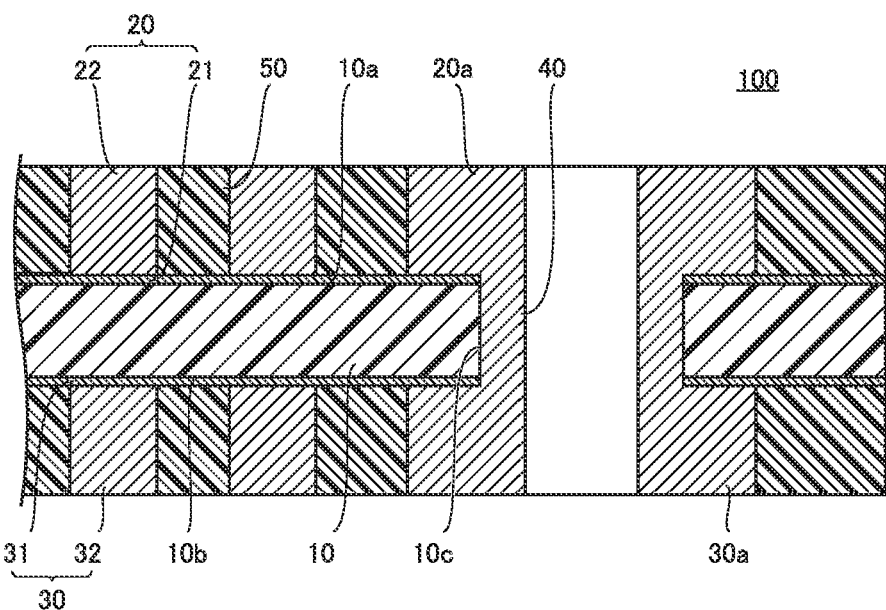
FIG. 7 is a cross-sectional view of flexible printed circuit board 100 after an electrolytic plating step S24 is performed.

FIG. 7 is a cross-sectional view of flexible printed circuit board 100 after electrolytic plating step S24 is performed. As shown in FIG. 7, in electrolytic plating step S24, flexible printed circuit board 100 is immersed in a plating solution and first layer 21 and third layer 31 are provided with power. As a result, second layer 22 is electroplated on first layer 21 exposed from resist layer 50, and fourth layer 32 is electroplated on third layer 31 exposed from resist layer 50.

Figure 8:
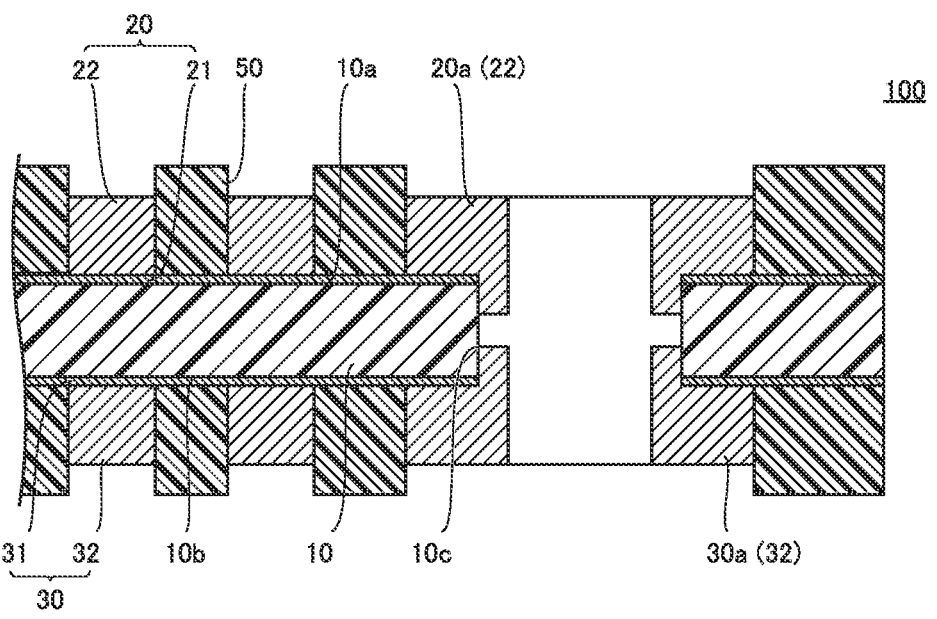
FIG. 8 is a cross-sectional view of flexible printed circuit board 100 during electrolytic plating step S24.

FIG. 8 is a cross-sectional view of flexible printed circuit board 100 during electrolytic plating step S24. As shown in FIG. 8, When thickness T2 and thickness T3 are time or more as large as thickness T1, second layer 22 also grows in a direction from first surface 10a toward second surface 10b along the inner wall surface of through hole during electrolytic plating step S24. In this case, when electrolytic plating step S24 is performed, fourth layer 32 is also grown in a direction from second surface 10b toward first surface 10a along the inner wall surface of through hole 10c. Second layer 22 and fourth layer 32 grown along the inner wall surface of through hole 10c are integrated to form electrically conductive layer 40.

Figure 9:
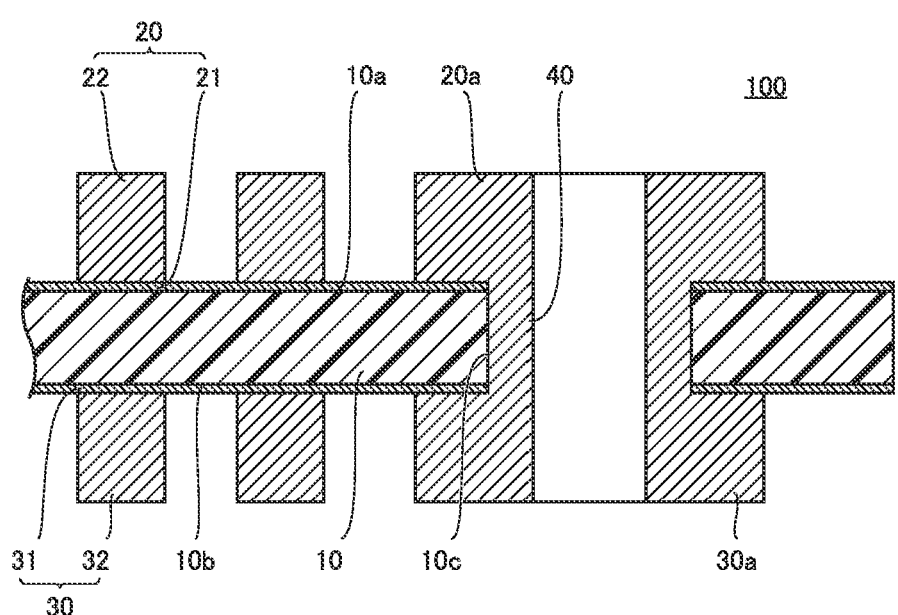
FIG. 9 is a cross-sectional view of flexible printed circuit board 100 after a resist removal step S25 is performed.

FIG. 9 is a cross-sectional view of flexible printed circuit board 100 after resist removal step S25 is performed. As shown in FIG. 9, in resist removal step S25, resist layer 50 is removed. In etching step S26, first layer 21 and third layer 31 under removed resist layer 50 are removed by etching. This etching is performed by wet etching or dry etching. As described above, flexible printed circuit board 100 having the structure shown in FIGS. 1 and 2 is manufactured.

(Advantageous Effects of Flexible Printed Circuit Board According to Embodiment)

Hereinafter, the advantageous effect of flexible printed circuit board 100 will be described in comparison with a flexible printed circuit board according to a comparative example (referred to as "flexible printed circuit board 100A").

Figure 10:
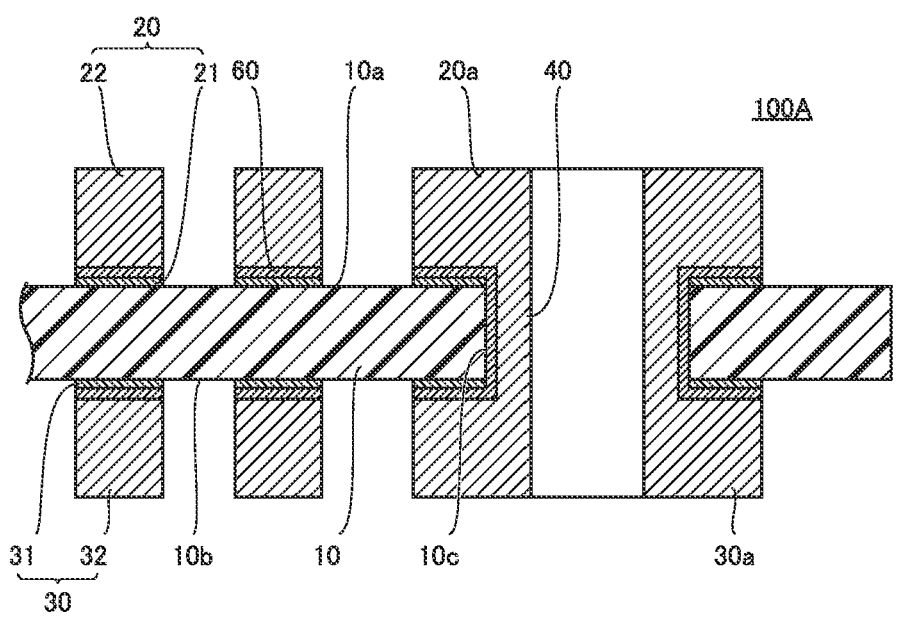
FIG. 10 is a cross-sectional view of a flexible printed circuit board 100A.

FIG. 10 is a cross-sectional view of flexible printed circuit board 100A. As Shown in FIG. 10, flexible printed circuit board 100A further includes an electroless plating layer 60. Electroless plating layer 60 is disposed between first layer 21 and second layer 22, between third layer 31 and fourth layer 32, and between the inner wall surface of through hole 10c and electrically conductive layer 40.

In other respects, flexible printed circuit board 100A is common to flexible printed circuit board 100. Also, electroless plating layer 60 is formed after through-hole formation step S22 and before resist-layer formation step S23.

Figure 11:
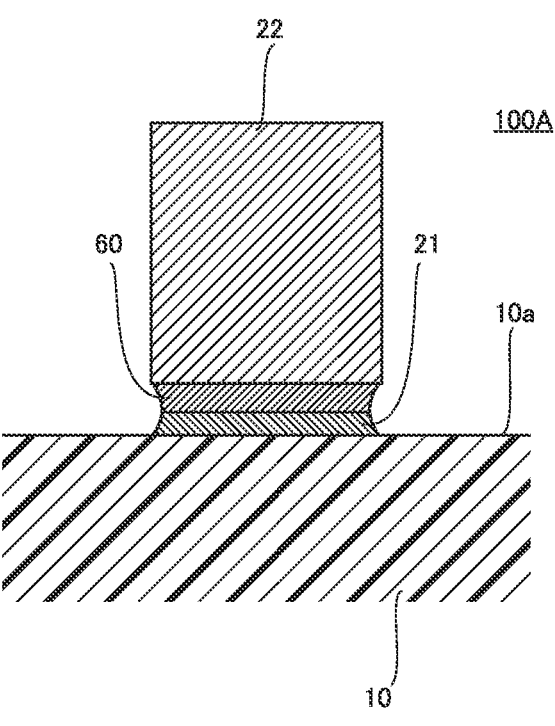
FIG. 11 is a cross-sectional view of flexible printed circuit board 100A in the vicinity of an electroless plating layer 60.

FIG. 11 is a cross-sectional view of flexible printed circuit board 100A in the vicinity of electroless plating layer 60. Since it is necessary to remove electroless plating layer 60 in addition to first layer 21 (third layer 31) in etching step S26, it takes a long time to perform etching step S26 for flexible printed circuit board 100A. In addition, in flexible printed circuit board 100A, etching is likely to proceed at an interface between first layer 21 (third layer 31) and electroless plating layer 60. Therefore, in flexible printed circuit board 100A, as shown in FIG. 11, an undercut is likely to occur under second layer 22 (fourth layer 32). The undercut of first wiring 20 refers to a phenomenon in which at least one of first layer 21, second layer 22, and electroless plating layer 60 at the bottom of first wiring 20 or at least one of interfaces between these layers is excessively etched as compared with the top of first wiring 20, so that the bottom of first wiring 20 is depressed. Similarly, the undercut of second wiring 30 refers to a phenomenon in which at least one of third layer 31, fourth layer 32, and electroless plating layer 60 at the bottom of second wiring 30 or at least one of the interfaces between these layers is excessively etched as compared with the top of second wiring 30, so that the bottom of second wiring 30 is depressed.

On the other hand, in flexible printed circuit board 100, since electroless plating layer 60 is not formed, the time required for etching step S26 is shortened and the interface between first layer 21 and electroless plating layer 60 does not exist. Therefore, according to flexible printed circuit board 100, the occurrence of an undercut under second layer 22 and fourth layer 32 is suppressed.

Figure 12:
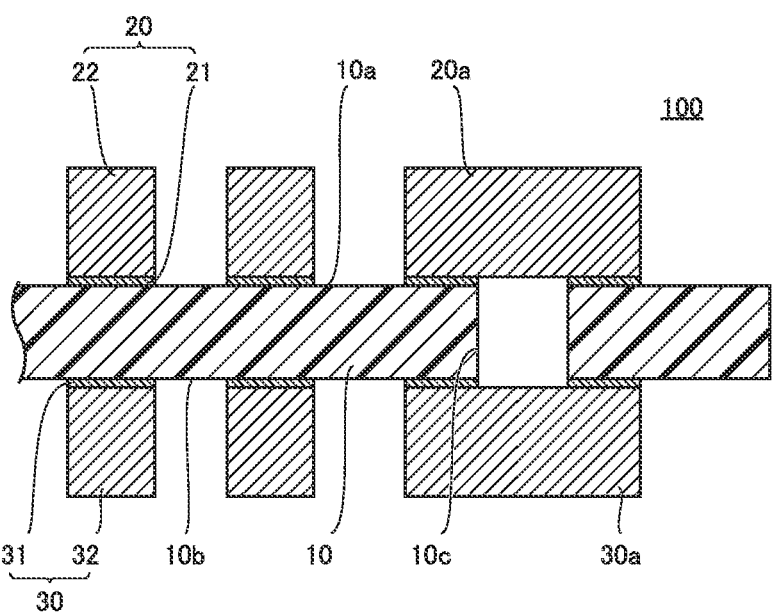
FIG. 12 is a cross-sectional view of flexible printed circuit board 100 after electrolytic plating step S24 is performed when an inner diameter D is less than a thickness T1.

FIG. 12 is a cross-sectional view of flexible printed circuit board 100 after electrolytic plating step S24 is performed when inner diameter D is less than thickness T1. As shown in FIG. 12, when inner diameter D is less than thickness T1, in electrolytic plating step S24, second layer 22 and fourth layer 32 may not grow along the inner wall surface of through hole 10c and may extend over through hole 10c. When inner diameter D is equal to or more than thickness T1, second layer 22 and fourth layer 32 easily grow along the inner wall surface of through hole 10c, and electrically conductive layer 40 easily ensures the electrical connection between first land 20a and second land 30a.

When each of thickness T2 and thickness T3 is one time or more as large as thickness T1, the peel strength of electrically conductive layer 40 on the inner wall surface of through hole 10c can be increased. When thickness T2 and thickness T3 are 2.0 times or less, 4.0 times or less, or 6.0 times or less as large as thickness T1, the peel strength of electrically conductive layer 40 on the inner wall surface of through hole 10c can be increased. When thickness T2 and thickness T3 are less than 0.5 times as large as inner diameter D, a part of through hole 10c is filled with electrically conductive layer 40, and generation of a void is suppressed.

EXAMPLES

In order to evaluate the reliability of electrically conductive layer 40, a heat shock test was performed on flexible printed circuit board 100. In the heat shock test, thickness T1, thickness T2, and thickness T3 were varied. Inner diameter D was constant at 100 μm. In the heat shock test, one cycle was set to change the temperature within a range of −40° C. to 130° C. for 30 minutes, and this was repeated 1000 cycles.

In the heat shock test, the electrical resistance value between first land 20a and second land 30a (i.e., the electrical resistance value of electrically conductive layer 40) was measured before the thermal cycle was applied and after 1000 cycles of the above-described thermal cycle were applied. In the heat shock test, electric resistance values were measured at 1000000 positions of electrically conductive layer 40 per sample.

In the heat shock test, when the electrical resistance value between first land 20a and second land 30a was within the range of ±5% of the initial value after 1000 cycles of the above-described thermal cycle were applied, the result was evaluated as "A". When the electrical connection was not made between first land 20a and second land 30a before the thermal cycle was applied, the result was evaluated as "C".

Further, when the electrical connection was made between first land 20a and second land 30a before the thermal cycle was applied, but the electrical resistance value between first land 20a and second land 30a was out of the range of ±5% of the initial value after 1000 cycles of the above-described thermal cycle were applied, the result was evaluated as "B".

TABLE 1

| | | Thickness T1 (μm) | | | | |
| --- | --- | --- | --- | --- | --- | --- |
| | | 5 | 12.5 | 25 | 50 | 100 |
| Thickness T2, | 5 | A | C | C | C | C |
| Thickness T3 | 8 | A | B | C | C | C |
| (μm) | 12.5 | A | A | B | C | C |
| | 20 | A | A | A | C | C |
| | 30 | A | A | A | B | C |
| | 40 | A | A | A | A | C |
| | 50 | A | A | A | A | B |
| | 75 | A | A | A | A | A |
| | 100 | A | A | A | A | A |

As shown in Table 1, when thickness T2 and thickness T3 were less than 0.5 time as large as thickness T1, the results of the heat shock test were all C. On the other hand, when thickness 12 and thickness T3 were 0.5 time or more as large as thickness T1, all the results of the heat shock test were B or more. From this, it is clear that electrically conductive layer 40 is properly formed on the inner wall surface of through hole 10c and the electrical connection between first land 20a and second land 30a is made by satisfying the condition that thickness T2 and thickness T3 are 0.5 time or more as large as thickness T1.

In addition, when thickness T2 and thickness T3 were 0.75 time or more as large as thickness T1, the results of the heat shock test were all A. From this, it is clear that the reliability of electrically conductive layer 40 against heat shock is improved by setting thickness T2 and thickness T3 to 0.75 time or more as large as thickness T1.

(Modification)

Hereinafter, flexible printed circuit board 100 (referred to as a "flexible printed circuit board 100B") according to a modification will be described. Here, points different from flexible printed circuit board 100 will be mainly described, and redundant description will not be repeated.

Figure 13:
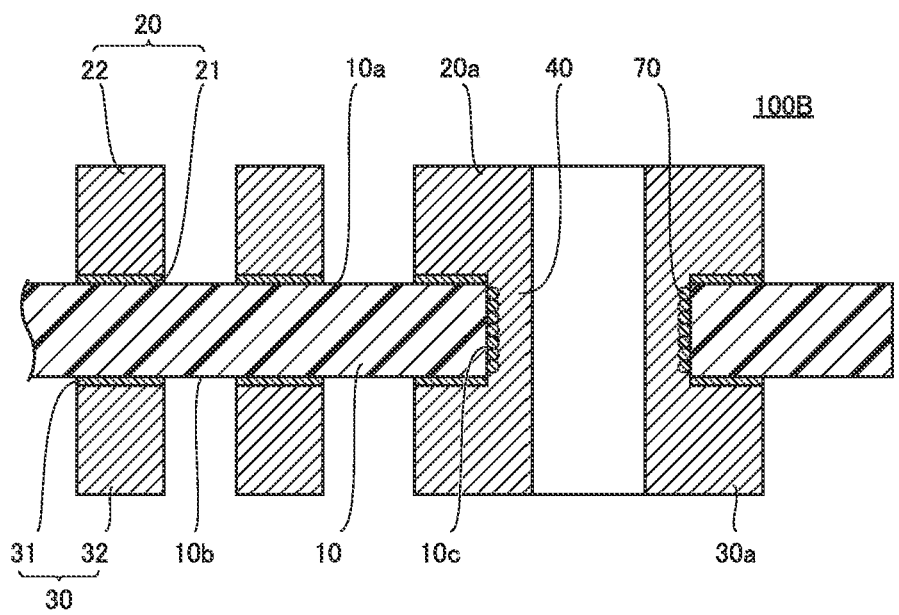
FIG. 13 is a cross-sectional view of a flexible printed circuit board 100B.

FIG. 13 is a cross-sectional view of flexible printed circuit board 100B. As shown in FIG. 13, flexible printed circuit board 100B further includes palladium particles 70. Palladium particles 70 are dispersed between the inner wall surface of through hole 10c and electrically conductive layer 40. In other respects, flexible printed circuit board 100B is common to flexible printed circuit board 100. Palladium particles 70 are disposed on the inner wall surface of through hole 10c after through-hole formation step S22 is performed and before resist-layer formation step S23 is performed.

In flexible printed circuit board 100, electrically conductive layer 40 is formed by the growth of second layer 22 from first surface 10a to second surface 10b along the inner wall surface of through hole 10c and by the growth of fourth layer 32 from second surface 10b to first surface 10a along the inner wall surface of through hole 10c. Therefore, voids may be generated near an area where second layer 22, which has grown from first surface 10a toward second surface 10b, contacts fourth layer 32, which has grown from second surface 10b toward first surface 10a.

On the other hand, in flexible printed circuit board 100B, in addition to the growth of second layer 22 from first surface 10a toward second surface 10b and the growth of fourth layer 32 from second surface 10b toward first surface 10a, the growth of the electrolytic plating layer on the inner wall surface of through hole 10c using palladium particles 70 as nuclei also contributes to the formation of electrically conductive layer 40, Therefore, according to flexible printed circuit board 100B, the above-described voids are prevented from being generated in electrically conductive layer 40.

It should be understood that the embodiments disclosed herein are illustrative in all respects and are not restrictive. The scope of the present disclosure is defined not by the embodiments described above but by the claims, and is intended to include all modifications within the meaning and scope equivalent to the claims.

REFERENCE SIGNS LIST

10 electrically insulating layer, 10a first surface, 10b second surface, 10c through hole, 20 first wiring, 20a first land, 21 first layer, 22 second layer, 30 second wiring, 30a second land, 31 third layer, 32 fourth layer, 40 electrically conductive layer, 50 resist layer, 60 electroless plating layer, 70 palladium particle, 100, 100A, 100B flexible printed circuit board, D inner diameter, S1 preparation step, S2 wiring formation step, S21 sputtering step, S22 through-hole formation step, S23 resist-layer formation step, S24 electrolytic plating step, S25 resist removal step, S26 etching step, T1, T2, T3 thickness.

The invention claimed is:

1. A flexible printed circuit board comprising:
an electrically insulating layer having a first surface and a second surface opposite to the first surface;
a first wiring disposed on the first surface;
a second wiring disposed on the second surface; and
an electrically conductive layer,
wherein the first wiring includes a first land,
wherein the second wiring includes a second land,
wherein the first wiring includes a first layer disposed on the first surface and a second layer disposed on the first layer,
wherein the second wiring includes a third layer disposed on the second surface and a fourth layer disposed on the third layer,
wherein the first land and the second land overlap each other in a plan view,
wherein the electrically insulating layer is provided with a through hole extending through the electrically insulating layer in a thickness direction and overlapping the first land and the second land at least partially in the plan view,
wherein the electrically conductive layer is disposed directly on an inner wall surface of the through hole to be connected to the first land and the second land, wherein the second layer, the fourth layer, and the electrically conductive layer are electrolytic plating layers made of the same material,
wherein a thickness of each of the first land and the second land is from 5 µm to 100 µm, wherein a thickness of the electrically insulating layer is from 5 µm to 100 µm,
wherein the thickness of each of the first land and the second land is 0.75 times or more as large as the thickness of the electrically insulating layer, and 6.0 times or less as large as the thickness of the electrically insulating layer,
wherein, when the flexible printed circuit board is subjected to a heat shock test in which the temperature is repeatedly cycled between −40° C. and 130° C. for a predetermined time at each temperature for 1000 cycles, electrical connection between the first land and the second land is maintained, and
wherein an inner diameter of the through hole is more than or equal to the thickness of the electrically insulating layer.

2. The flexible printed circuit board according to claim 1, wherein the first layer is a sputtered layer.

3. A flexible printed circuit board comprising:
an electrically insulating layer having a first surface and a second surface opposite to the first surface;
a first wiring disposed on the first surface;
a second wiring disposed on the second surface; and
an electrically conductive layer,
wherein the first wiring includes a first land,
wherein the second wiring includes a second land,
wherein the first wiring includes a first layer disposed on the first surface and a second layer disposed on the first layer,
wherein the second wiring includes a third layer disposed on the second surface and a fourth layer disposed on the third layer,
wherein the first land and the second land overlap each other in a plan view,
wherein the electrically insulating layer is provided with a through hole extending through the electrically insulating layer in a thickness direction and overlapping the first land and the second land at least partially in the plan view,
wherein palladium particles are disposed directly on the inner wall surface of the through hole,
wherein the electrically conductive layer is disposed directly on the palladium particles and is connected to the first land and the second land,
wherein the second layer, the fourth layer, and the electrically conductive layer are electrolytic plating layers made of the same material,
wherein a thickness of each of the first land and the second land is from 5 µm to 100 µm, wherein a thickness of the electrically insulating layer is from 5 µm to 100 µm,
wherein the thickness of each of the first land and the second land is 0.75 times or more as large as the thickness of the electrically insulating layer, and 6.0 times or less as large as the thickness of the electrically insulating layer,
wherein, when the flexible printed circuit board is subjected to a heat shock test in which the temperature is repeatedly cycled between −40° C. and 130° C. for a predetermined time at each temperature for 1000 cycles, electrical connection between the first land and the second land is maintained, and wherein an inner diameter of the through hole is more than or equal to the thickness of the electrically insulating layer.

4. A method of manufacturing a flexible printed circuit board, the method comprising:

preparing an electrically insulating layer; and forming a first wiring including a first land, and a second wiring including a second land, wherein the electrically insulating layer has a first surface and a second surface opposite to the first surface, wherein the electrically insulating layer is provided with a through hole extending through the electrically insulating layer in a thickness direction and overlapping the first land and the second land at least partially in a plan view, wherein the forming of the first wiring and the second wiring includes forming a first layer on the first surface, forming a first resist layer on the first layer, forming a second layer on the first layer exposed from the first resist layer, forming a third layer on the second surface, forming a second resist layer on the third layer, and forming a fourth layer on the third layer exposed from the second resist layer, wherein the forming of the second layer and the forming of the fourth layer are performed by electrolytic plating, wherein, in the forming of the second layer and the forming of the fourth layer, the second layer and the fourth layer grow along an inner wall surface of the through hole to form an electrically conductive layer directly on the inner wall surface of the through hole, wherein the first resist layer and the second resist layer are removed after the second layer and the fourth layer are formed, wherein the first layer below the first resist layer that has been removed and the third layer below the second resist layer that has been removed are removed by etching after the second layer and the fourth layer are formed, and wherein a thickness of each of the first land and the second land is 0.5 time or more as large as a thickness of the electrically insulating layer.

* * * * *